(12) United States Patent
Bosco et al.

(10) Patent No.: US 7,245,009 B2
(45) Date of Patent: Jul. 17, 2007

(54) HERMETIC CAVITY PACKAGE

(75) Inventors: Bruce A. Bosco, Phoenix, AZ (US);
Rudy M. Emrick, Gilbert, AZ (US);
Steven J. Franson, Scottsdale, AZ (US); John E. Holmes, Scottsdale, AZ (US); Stephen K. Rockwell, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 155 days.

(21) Appl. No.: 11/174,268

(22) Filed: Jun. 29, 2005

(65) Prior Publication Data

US 2007/0001287 A1    Jan. 4, 2007

(51) Int. Cl.
*H01L 23/10* (2006.01)

(52) U.S. Cl. .............. 257/710; 257/711; 257/787; 257/E23.128; 257/E23.059

(58) Field of Classification Search ......... 257/710, 257/711, 678, 687, 787, 794, E23.128, E23.18, 257/E23.031, E23.059
See application file for complete search history.

(56) References Cited

U.S. PATENT DOCUMENTS 4,961,106 A * 10/1990 Butt et al. ............... 257/710

7,136,594 B2 * 11/2006 Nakanishi et al. .......... 398/164
2004/0207059 A1    10/2004 Hong
2004/0207077 A1    10/2004 Leal et al.
2004/0211506 A1    10/2004 Wang et al.
2004/0214374 A1    10/2004 Sakamoto et al.

OTHER PUBLICATIONS

Xuefeng Wang et al., Micromachining Techniques For Liquid Crystal Polymer, IEEE, 2001 p. 126-130.
Rogers Corporation, Rogers R/flex® 3000 Liquid Crystalline Polymer Circuit Material R/flex® 3850 Double Clad Laminate, Data Sheet RF1.3850, 2003 Publication #14-021, Advanced Circuit Materials Division, Chandler, AZ.

* cited by examiner

*Primary Examiner*—Wael Fahmy
*Assistant Examiner*—(Vikki) Hoa B. Trinh

(57) ABSTRACT

A packaging structure (10) is provided having a hermetic sealed cavity for microelectronic applications. The packaging structure (10) comprises first and second packaging layers (12, 28) forming a cavity. Two liquid crystal polymer (LCP) layers (16, 22) are formed between and hermetically seal the first and second packaging layers (12, 28). First and second conductive strips (18, 20) are formed between the LCP layers (16, 22) and extend into the cavity. An electronic device (24) is positioned within the cavity and is coupled to the first and second conductive strips (18, 20).

23 Claims, 2 Drawing Sheets

HERMETIC CAVITY PACKAGE

FIELD OF THE INVENTION

The present invention generally relates to electronic circuit packaging, and more particularly to packaging having a hermetic cavity for microelectronic applications.

BACKGROUND OF THE INVENTION

With the growth of the use of personal communication devices, e.g., cell phones and two way radios, high performance and high frequency packaging materials have increased in importance. Desired characteristics for electronic packaging include high electric and thermal performance, thinness, low weight, small size, high component density, and low cost.

Conventional packages are fabricated from materials such as plastic, Teflon or ceramics. The type of material that is used depends on a number of factors which include frequency of operation, environment and cost. Plastic packages are typically the lowest in cost but may not be suitable for high frequencies of operation or very high temperatures. Applications that require exposure to extreme temperatures will commonly use ceramics. As the frequency of operation increases, it becomes advantageous to utilize materials that have lower dielectric constants to allow for the implementation so that the final package, with interconnects, will avoid noise or signal loss associated with high speed circuits.

Furthermore, as electronic devices continue to follow the trend of miniaturization, moisture and dust become more of a hindrance to maintaining functionality of such electronic devices. Patterned metal films generally have a thickness less than 25 µm and line widths of 50 µm or less for operating frequencies in the 1.0 to 100 GHz.

In U.S. Patent Application 2004/0207059, an adhesive between ceramic layer was used to seal a cavity. However, the adhesive material is substantially rigid, resulting in potential stress issues. Furthermore, the package is not inherently hermetic, the adhesive serves no purpose other than attaching the cover, and neither a multilayer interconnection nor low loss transmission lines are taught.

Accordingly, it is desirable to provide packaging having a hermetic cavity for microelectronic applications. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A packaging structure is provided having a hermetic sealed cavity for microelectronic applications. The packaging structure comprises first and second packaging layers forming a cavity. Two LCP layers are formed between and hermetically seal the first and second packaging layers. First and second conductive strips are formed between the LCP layers and extend into the cavity. An electronic device is positioned within the cavity and is coupled to the first and second conductive strips.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
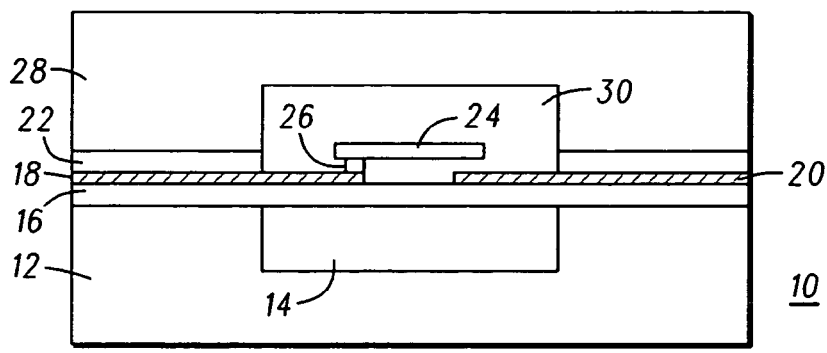
FIG. 1 is a cross section view of a packaging structure in accordance with a first exemplary embodiment of the present invention.
Figure 6:
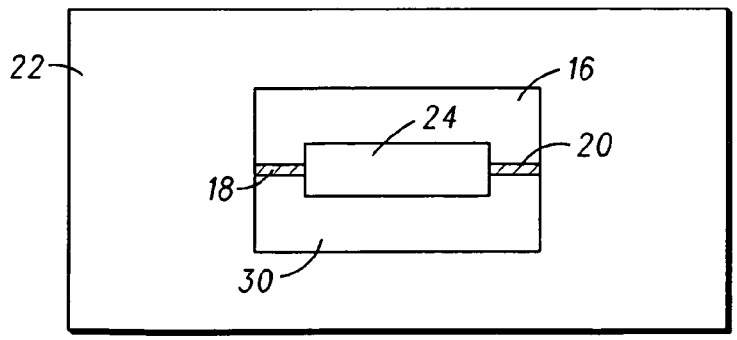
FIG. 6 is a top cut away view of the packaging structure of FIG. 1.

Referring to FIGS. 1 and 6, a package structure 10 in accordance with an exemplary embodiment of the present invention comprises a substrate 12 having a cavity 14 formed therein using standard fabrication techniques. The substrate 12 may simply be a layer in a larger structure. A layer 16 of a liquid crystal polymer (LCP) is formed on a surface of the substrate 12. A strip of conductive material is formed on the layer 16 to extend over the cavity 14 with an opening therein and patterned to form first and second conductors 18, 20. The conductive material preferably comprises gold, but may comprise any conductive material used in the electronic industry. A second layer 22 of LCP is formed above the first and second conductors 18, 20. The thickness of the layers 16, 22 may range from 1 mil to 30 mils; however, the thickness of the layers 16, 22 may be dependent upon the frequency needed for a particular application. Although the two layers 16, 22 are preferred for providing better sealing, only one of the two layers 16, 22 may be used. A device 24 is positioned in contact with one or both of the first and second conductors 18, 20 to complete an electrical circuit. The device 24, as shown, is affixed to a conductive bump 26 to provide elevation above the second conductor 20. It should be understood that the package structure 10 with a cavity can be applied to devices 24 having circuits thereon such as micro electromechanical system (MEMS) devices, for example, switches and resonators, and transmission line structures, resonators, filters, waveguides, passive elements such as resistors and inductors, and active devices such as monolithic microwave integrated circuits (MMICs). A layer 28 of a material preferably the same as that of the substrate, is formed on the layer 22 (for ease of understanding, FIG. 6 does not include layer 28). A second cavity 30 is formed in the layer 26 using standard fabrication techniques and is aligned above the cavity 14 to form a cavity. Substrate 12 and layer 28 preferably comprise a low temperature cofired multi-layer ceramic (LTCC) material, but may alternative comprise any type of material used for electronic circuits or packaging, for example, polymeric or organic materials, ceramic, silicon, germanium, silicon/germanium, or a III-V compound. For LTCC material, a multi-layer ceramic green sheet can typically be made around 50 μm in minimum thickness. After sintering, this thickness will decrease to about 25 μm.

The package structure 10 is heated to about 260° to 270° C., or just below the melting temperature of the LCP layers. Pressure is applied while heating using a clamp and plate mechanism (not shown), for example, to apply a moderate amount of force to increase adhesion. The package structure 10 would then be cooled, singulated, externally metallized or coated if required and other optional post-processing steps.

Placing the device 24 in a hermetic cavity protects it from dust, smoke, and other particulate contaminants, as well as humidity. The cavity could be evacuated, or could be filled with inert gas. The cavity would provide physical protection should the device 10 be fragile. And as described later, the cavity would provide a means of implementing high Q-factor resonator devices and low loss transmission lines by suspending the transmission line above the air or dielectric-filled cavity.

Figure 2:
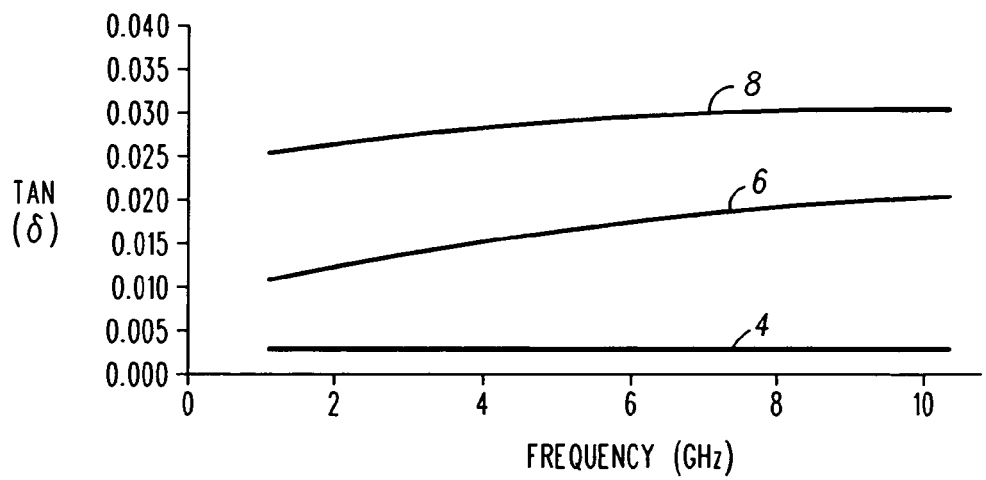
FIG. 2 is a graph demonstrating the moisture barrier properties of the material used in an exemplary embodiment of the present invention.

LCP combines the properties of polymers with those of liquids and provide superior thermal and electrical properties including low loss, low dielectric constant, and low coefficient of thermal expansion (CTE) characteristics. LCP is especially advantageous for RF devices due to their low signal loss and low dielectric constant (3.01 at 1 MHz) over a wide frequency range and superior moisture barrier properties (0.04% water absorption). FIG. 2 shows that LCP 4 demonstrates superior moisture barrier properties as compared with two other conventional substrate materials, an organic material 6 and polyimide 8, relative to loss tangent. The dielectric constant is important for RF devices because it determines the characteristic impedance of the circuitry, which relates to size and to the signal loss of the circuitry. Loss tangent is important and directly related to circuit signal losses and Q factor. Q factor is a figure merit in filters, resonators, and low noise circuits.

LCP is an ordered thermoplastic polymer with long stiff molecules that offer an excellent combination of electronic, thermal, mechanical and chemical properties that make them an excellent material choice for electronic devices. LCPs are highly crystalline materials based on aromatic ring-structured compounds that are very stable after polymerizing. Characteristics of a particular LCP depend on the manufacturer, but exist in a variety of unfilled, glass-filled, mineral-filled, carbon fiber reinforced, and glass fiber-reinforced grades that allow for numerous options in key properties such as the CTE. LCP laminates have a CTE that can be readily matched to that of ceramic, silicon and other materials. Also, the high moisture and chemical resistance improve LCP performance in unfriendly operating environments, and the low CTE, low dielectric constant, and high dielectric strength make it desirable as circuit board laminates for electronics packaging. Furthermore, LCP has a high moisture barrier which may be used to seal and protect electronic components from high humidity.

LCP layers would be manufactured in sheet form using standard processes known to the industry. A selection of off-the-shelf and/or customized CTE LCP layers would be made for a particular application. The layers would be laminated using interleaved adhesive layers or alternating single sided metalized LCP layers, or other standard method in conjunction with the proper heat and pressure to achieve proper bonding.

Figure 3:
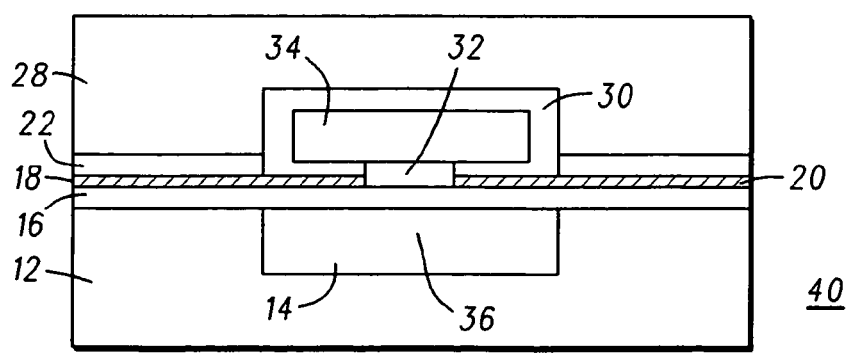
FIG. 3 is a cross section view of a packaging structure in accordance with a second exemplary embodiment of the present invention.

Referring to FIG. 3, a second exemplary embodiment comprises the packaging structure 40 including the substrate 12, layer 28, LCP layers 16, 22, and conductors 18, 20 as described in FIG. 1. A strip line 32, is coupled between the conductors 18, 20. A suspended strip line provides for lower loss. An active or passive device 34, a MMIC for example, is connected on the device 32, and therefore, being encapsulated within the cavity, is protected from dust, smoke, water vapor, etc. An optional LCP foam filler 36 is formed in the cavity 14.

The foam filler 36, preferably a low dielectric foam, for example an LCP foam having a dielectric constant between that of air and of the LCP layers 16, 22, would provide mechanical support for the device 10.

Figure 4:
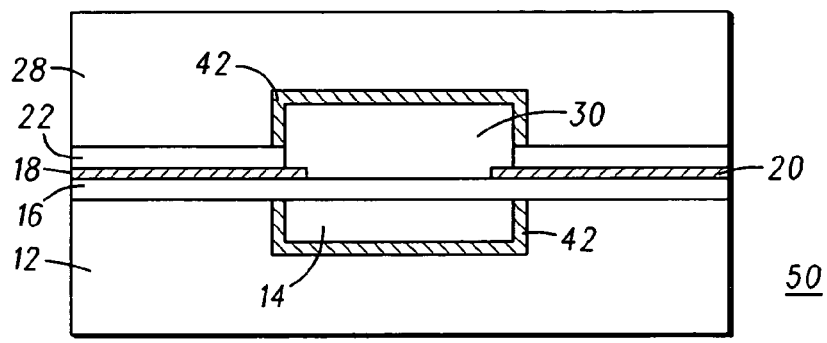
FIG. 4 is a cross section view of a packaging structure in accordance with a third exemplary embodiment of the present invention.

Referring to FIG. 4, a third exemplary embodiment comprises the substrate 12, layer 28, LCP layers 16, 22, and conductors 18, 20 as described in FIG. 1. Metal plating 42 is formed on the inside of the cavities 14, 30 by patterning and/or by forming vias in a manner known to those in the industry. The metal plating 42 preferably has a thickness of 15 μm, but may comprise a thickness in the range of 5-50 μm. This metal plating 42 provides a resonant cavity when an RF signal is applied to conductors 18, 20. The dimensions of the cavity will define the resonant frequency. This form of air filled cavity will provide a high Q resonant performance.

Figure 5:
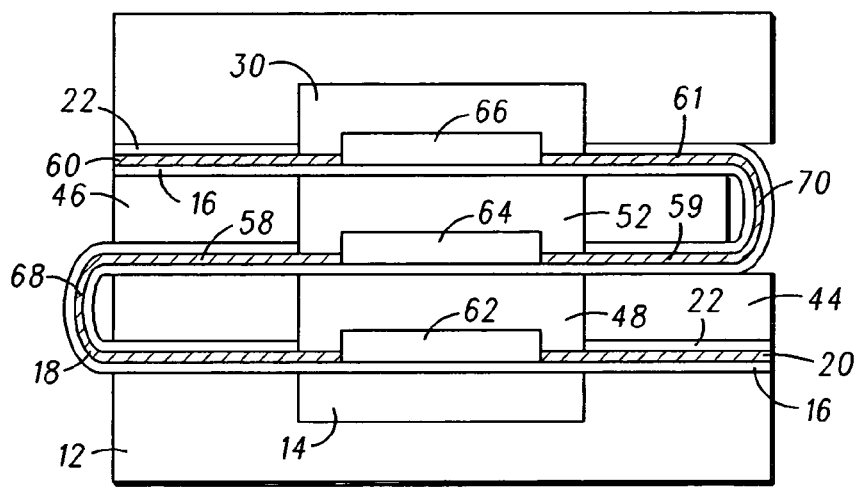
FIG. 5 is a cross section view of a packaging structure in accordance with a fourth exemplary embodiment of the present invention.

Referring to FIG. 5, a fourth exemplary embodiment comprises the packaging structure 50 including the substrate 12, layer 28, LCP layers 16, 22 and conductors 18, 20 as described in FIG. 1. Between the electrical conductors 18, 20 and the layer 28, a plurality of additional LCP layers 44, 46 are formed in a like fashion as layer 28; however, opening 48, 52 are formed using standard fabrication techniques to form a single cavity comprising cavities 14, 30 and openings 48, 52. LCP layers 16, 22 and electrical conductor 18 are formed (curved) around to be positioned between layers 44, 46 and layers 28. 46, respectively. The material of layers 44, 46 may comprise any material as used for the substrate 14. Thus, conductors 58, 59 are formed on the LCP layer 54 and extend into the opening 48, and conductors 60, 61 are formed on the LCP layer 56, and extend into the opening 52.

Several devices 62, 64, 66 may thereby be placed within a single cavity. Additionally, an optional flexible conductor may be used for the conductors 16, 58, 59, 60, 61. In this embodiment, the conductors 16, 58, 59, 60, 61 would comprise a single sheet of metal with a flexible curved portion 68 integrally connecting conductors 18 and 58, and a flexible curved portion 70 integrally connecting conductors 59 and 61. The packaging structure 50 provides a high level of integration, intentional electrical mechanical coupling of structures on different layers, and a three dimensional package. These devices 62, 64, 66 may comprise filters, resonators, sampling structures, multi-port coupling structures, coupled vertical interconnects. The flexible portions 68, 70 may optionally be formed in an area away from the substrate 12 and layers 44, 46, or in an area above the substrate 12 and below the layer 28 as shown.

The present invention utilizes a low temperature, co-fired, multi-layer ceramic technology having a LCP material between the ceramic layers to provide a hermetically sealed cavity; thereby protecting electronic devices within the cavity from, for example, smoke, dust, and humidity.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A packaging structure comprising:
a first packaging layer;
a first liquid crystal polymer layer formed on the first packaging layer;
a second liquid crystal polymer layer formed on the first liquid crystal polymer layer;
a second packaging layer formed on the second liquid crystal polymer layer, the first and second packaging layers forming first and second cavities separated by the first liquid crystal polymer layer extending through the cavity and the first and second liquid crystal polymer layers forming a hermetic seal between the first and second packaging layers;
a first metal strip formed between the first and second liquid crystal polymer layers and extending into the cavity;
a second metal strip formed between the first and second liquid crystal polymer layers and extending into the cavity; and
an electronic device positioned on the first liquid crystal polymer layer within the second cavity and coupled to the first and second metal strips.

2. The packaging structure of claim 1 wherein the first and second liquid crystal polymer layers each comprise a thickness of between 1 and 30 mils.

3. The packaging structure of claim 1 wherein the electronic device comprises one of a micro electromechanical system (MEMS) device, an active device, a passive device, and a transmission line structure.

4. The packaging structure of claim 3 wherein the active device comprises a monolithic microwave integrated circuit.

5. The packaging structure of claim 1 wherein the electronic device comprises one of a transmission line structure, a resonator, a filter, and a waveguide.

6. The packaging structure of claim 1 wherein the first and second packaging layers both comprise a material selected from the group consisting of one of ceramic polymer, organic, silicon, germanium, silicon/germanium, and a III-V compound.

7. A packaging structure comprising:
a first packaging layer;
a second packaging layer;
a liquid crystal polymer layer formed between and hermetically sealing the first and second packaging layers, the first and second packaging layers forming first and second cavities separated by the liquid crystal polymer layer extending through the cavity;
a first conductive strip formed between the liquid crystal polymer layer and one of the first and second packaging layers and extending into the second cavity; and
a second conductive strip formed between the liquid crystal polymer layer and one of the first and second packaging layers and extending into the second cavity.

8. The packaging structure of claim 7 wherein the liquid crystal polymer layer comprises a thickness of between 1 and 30 mils.

9. The packaging structure of claim 7 wherein the first and second packaging layers both comprise a material selected from the group consisting of one of ceramic polymer, organic, silicon, germanium, silicon/germanium, and a III-V compound.

10. A multi-layered packaging structure comprising:
at least two packaging layers;
at least one liquid crystal polymer layer formed between each of the at least two packaging layers, the at least two packaging layers forming first and second cavities separated by the at least one liquid crystal polymer layer;
at least two conductive strips formed on each of the at least one liquid crystal polymer layers and extending into the cavity; and
at least one electronic device positioned on the at least one liquid crystal polymer layer within the second cavity and, coupled to at least one of the at least two conductive strips.

11. The packaging structure of claim 10 wherein the at least one liquid crystal polymer layer comprises a layer having a thickness of between 1 and 30 mils.

12. The packaging structure of claim 10 wherein the electronic device comprises one of a micro electromechanical system device, an active device, a passive device, and a transmission line structure.

13. The packaging structure of claim 12 wherein the active device comprises a monolithic microwave integrated circuit.

14. The packaging structure of claim 10 wherein the electronic device comprises one of a transmission line structure, a resonator, a filter, and a waveguide.

15. The packaging structure of claim 10 wherein the first and second packaging layers both comprise comprise a material selected from the group consisting of one of ceramic a polymer, organic, silicon, germanium, silicon/germanium, and a III-V compound.

16. The packaging structure of claim 10 wherein one of the at least 2 conductive strips and the at least one liquid crystal polymer layer wraps around to be positioned between each of the at least two packaging layers.

17. The packaging structure of claim 10 wherein the electronic devices comprises one or more of filters, resonators, sampling structures, multi-port coupling structures, and coupled vertical interconnects.

18. The packaging structure of claim 1 further comprising:
a third packaging layer formed contiguous to the second packaging layer to form a third cavity separated from the second cavity by the second liquid crystal polymer layer;
a third metal strip formed between the first and second liquid crystal polymer layers; and
a second electronic device positioned on the second liquid crystal polymer layer within the third cavity and coupled to the first and third metal strip.

19. The packaging structure of claim 7 further comprising an electronic device positioned on the liquid crystal polymer layer within the cavity and coupled to the first and second conductive strips.

20. The packaging structure of claim 7 further comprising a conductive layer formed on the first and second packaging layers within the cavity.

21. The packaging structure of claim 19 wherein the electronic device comprises one of a micro electromechanical device, an active device, a passive device, and a transmission line structure.

22. The packaging structure of claim 21 wherein the active device comprises a monolithic microwave integrated circuit.

23. The packaging structure of claim 19 wherein the first and second packaging layers both comprise a material selected from the group consisting of one of a ceramic, polymer, organic, silicon, germanium, silicon/germanium, and a III-V compound.

* * * * *